United States Patent [19]

Dias et al.

[11] 3,878,477

[45] Apr. 15, 1975

[54] ACOUSTIC SURFACE WAVE OSCILLATOR FORCE-SENSING DEVICES

[75] Inventors: J. Fleming Dias; Henry E. Karrer, both of Palo Alto, Calif.

[73] Assignee: Hewlett-Packard Company, Palo Alto, Calif.

[22] Filed: Jan. 8, 1974

[21] Appl. No.: 404,829

[52] U.S. Cl. .............. 331/40; 73/88.5 R; 73/DIG. 4; 310/8.5; 310/9.8; 331/65; 331/107 A

[51] Int. Cl. ..... G01b 7/16; H03b 5/32; H03b 21/00

[58] Field of Search ............. 331/37, 40, 65, 107 A; 73/88.5 R, 88.5 SD, DIG. 4; 310/8.3, 8.5, 8.6, 8.7, 8.8, 9.7, 9.8

[56] References Cited

UNITED STATES PATENTS

| | | | |
|---|---|---|---|
| 3,350,944 | 11/1967 | DeMichele | 331/65 X |
| 3,756,081 | 9/1973 | Young | 331/65 X |
| 3,766,496 | 10/1973 | Whitehouse | 331/107 A |
| 3,805,189 | 4/1974 | Zucker et al. | 331/107 A |

*Primary Examiner*—Siegfried H. Grimm
*Attorney, Agent, or Firm*—F. David LaRiviere; A. C. Smith

[57] ABSTRACT

An acoustic surface wave oscillator is employed as a force-sensing device. Dual acoustic surface wave oscillators coupled to a single substrate of piezoelectric material which inversely change their respective frequencies in response to a force applied normal to the surface of the substrate comprise a high-sensitivity, temperature-compensated force-sensing device. The outputs of the oscillators are applied to an electronic mixer circuit to produce a difference frequency output signal which is a function of the applied force. Other configurations utilizing the force-sensing properties of acoustic surface wave oscillators are disclosed.

11 Claims, 13 Drawing Figures

ACOUSTIC SURFACE WAVE OSCILLATOR FORCE-SENSING DEVICES

BACKGROUND OF THE INVENTION

Acoustic surface wave (ASW) devices such as delay lines and bandpass filters have existed for several years. In all of these devices, an ASW is generated at one location on a substrate, propagates to another location with a certain transit time and is then detected. Since most of the wave energy is confined to within one wave length of the surface of the material on which the wave is propagated, the ASW can be processed and detected on the surface while the substrate material below a depth of about one wave length as well as the under mounting surface is essentially inert. Therefore, ASW devices are easier to design and produce than their bulk wave counterparts.

Acoustic surface waves are usually generated and propagated on a piezoelectric substrate. The ASW generator and receiver transducers are commonly vacuum deposited transducers, each consisting of interdigital finger pairs spaced one-half acoustic wave length apart. Such interdigital (ID) transducers are most effective on piezoelectric substrates. These substrates can be single crystal (quartz or lithium niobate), poled ceramics or piezoelectric films on non-piezoelectric substrates (zinc oxide on fused quartz).

SUMMARY OF THE INVENTION

The preferred embodiment of the present invention utilizes the frequency changes occurring in dual, reciprocally-interacting ASW oscillators coupled to a common piezoelectric substrate to measure the magnitude of an unknown force applied to that substrate while remaining relatively insensitive to ambient temperature change. Accurate, high-resolution measurement of force, weight, pressure, acceleration and voltage may be performed by employing the principles of this invention.

An ASW device may be configured as an oscillator by returning the signal at a receiver ID transducer to a generator ID transducer via a feedback amplifier. This configuration has been used to measure the temperature coefficient of delay for lithium niobate delay lines by measuring the oscillator frequency as a function of temperature. Until now, however, the advantages of using ASW oscillators to measure the magnitude of force have not been recognized.

Before the present invention, force-sensing devices, which provided pulse-rate or difference frequency output signals, employed either more than one oscillating piezoelectric crystal or one piezoelectric crystal together with elaborate external electronic circuitry to obtain a difference frequency output signal. The crystals were excited to oscillate in thickness shear mode which provide inadequate sensitivity and temperature versus frequency stability. This invention provides a more sensitive force-sensing device with improved temperature compensation and pulse-rate or difference frequency output. The force-sensing devices described herein do not exhibit the undesirable characteristics of devices using thickness shear mode of oscillation in piezoelectric materials. Moreover, when constructed according to the principles of this invention, a single substrate of piezoelectric material can accommodate the operation of two or more ASW oscillator devices.

DESCRIPTION OF THE PREFERRED EMBODIMENT

Figure 1:
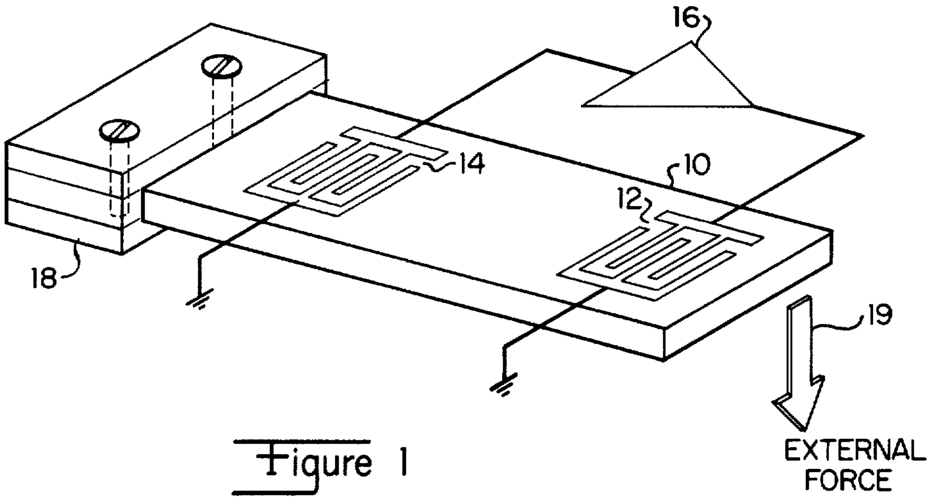
FIG. 1 is a schematic diagram of an acoustic surface wave oscillator used as a force-sensing device.

FIG. 1 shows a schematic diagram of ASW force-sensing device, which illustrates the basic operation of the several embodiments of this invention. These force-sensing devices translate changes in a dimension and some physical characteristics of the piezoelectric material between the transducers of an ASW oscillator produced by an applied force into a change in the output signal frequency of the oscillator. Referring to FIG. 1, there is shown an ASW force-sensing device comprising substrate 10, on which is deposited a set of two transducers, 12 and 14 respectively, a predetermined distance, l, apart. The input of amplifier 16 is connected to transducer 14 and the output of amplifier 16 is connected to transducer 12 to form an ASW oscillator. Substrate 10 is held in place by mounting 18 so that it elastically deforms the area of piezoelectric material between transducers 12 and 14 in response to applied force 19.

Acoustic surface waves travel from generator transducer 12 to receiver transducer 14 with a velocity ($v_x$) and transit time ($\tau$). They are detected at receiver transducer 14, amplified and fed back to the input by amplifier 16. The amplifier gain need only be sufficient to achieve at least unity loop gain.

The oscillator frequency $f_n$ is determined by the phase condition:

$$2\pi\eta = \tau\omega_n + \phi_\epsilon \qquad (1)$$

where $\eta$ — an integer (determines mode)

$\tau$ — transit time $= l/v_s$ $\omega_o$ — frequency $= 2\pi f_o$ $\phi_\epsilon$ — phase shift in amplifier and interdigital transducers Equation (1) describes a system with an infinite number of modes of oscillation. The actual single mode of oscillation is determined by the bandpass characteristics of the ID generator and receiver transducers, 12 and 14 respectively, and the frequency characteristics of amplifier 16. Each ID transducer is similar to a bandpass filter with center frequency $f_s$ determined by the finger spacing which is one-half wave length $\lambda_s$ of the desired frequency, where $f_s = v_s/\lambda_s$. The $3db$ bandwidth of an ID transducer is approximated by 1/N, where N is the number of finger pairs. The transducer shown in FIG. 1*a* has 5 fingers and 4 finger pairs.

Figure 2:
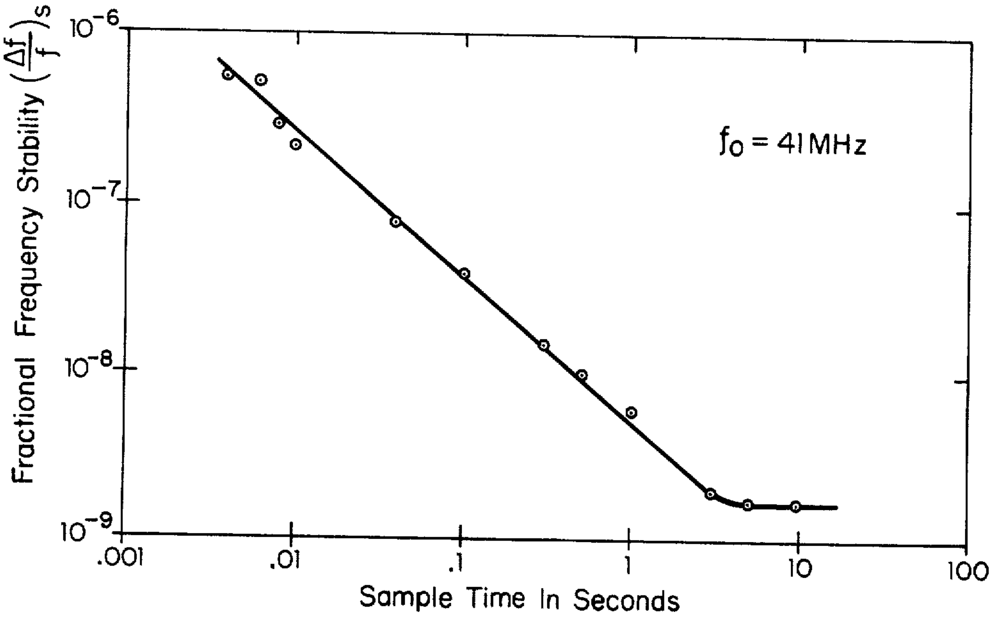
FIG. 2 is a plot of the frequency stability of an acoustic surface wave oscillator.

The oscillator stability is determined by the phase stability of various components in the loop. The loop must be designed so that the phase slope of the delay line ($d\phi/dw = \tau$) is much larger than the phase slopes, $d\phi_\epsilon/dw$, for other loop components. Therefore, when $\tau = d\phi/dw > d\phi_\epsilon/dw$, the phase shift in the substrate will dominate and hence control the oscillator stability. The fractional frequency stability of the ASW oscillator used in the force-sensing device of FIG. 1 is graphically presented in FIG. 2.

Since $\eta$ and $\phi_\epsilon$ in Equation (1) are constants, the oscillator frequency is a function of $\tau = l/v_s$. If $v_s$ is constant for a given elastic medium, the frequency of the output signal of the oscillator changes as the length l between ID transducers 12 and 14, is changed (for example by applying an external force 19 to elongate the substrate). However, $v_s$ is not constant when the substrate is subjected to stress. Applied force 19 causes variations in elastic constants and density to occur in piezoelectric substrate 10 which in turn affects the surface wave velocity $v_s$ between ID transducers 12 and 14. Since the frequency of the oscillator changes as a function of both $v_s$ and l in response to applied force, the frequency of the output signal of the force-sensing device shown in FIG. 1 varies as a function of applied force 19. Similar stresses also arise in piezoelectric substrate 10 in response to a change in temperature thereof. Therefore, ASW oscillator frequency $f_o$ is a function of $v_s$ as given by:

$$f_o = \left(\frac{v_s(t,\sigma)}{\lambda_s}\right) + \left(\frac{v_s(t,\sigma)}{l}\right)$$

where $\lambda_s$ is the wave length selected by the ID transducers and $v_s$ is a function of substrate temperature, $t$, and stress, $\sigma$. In the mounting configuration of the embodiment shown in FIG. 1, the substrate forms a cantilevered beam whose axis is parallel to the path of ASW propagation. Other variations of substrate mounting and transducer orientation are anticipated by this invention and are described later in this application.

The principal parameters for the force-sensing device described above are its sensitivity and stability. The normalized stress sensitivity may be expressed as:

$$S = \frac{\Delta f/f_o}{\Delta\sigma}\left(\frac{1}{\text{psi}}\right).$$

where $\sigma$ is the stress along the path of acoustic surface wave propagation (not necessarily co-linear with $v_s$). This stress sensitivity is a property of the material and is caused by changes in elastic constants, density and length as a fuunction of stress.

The force-sensing device stability is dependent upon the stability of the ASW oscillator and may be expressed as the fractional frequency stability, $(\Delta f/f_o)_s$. Therefore, the transducer resolution is the product:

$$\left(\Delta f/f_o\right)_s \frac{1}{S} = \Delta\sigma(\text{psi})$$

Figure 3A:
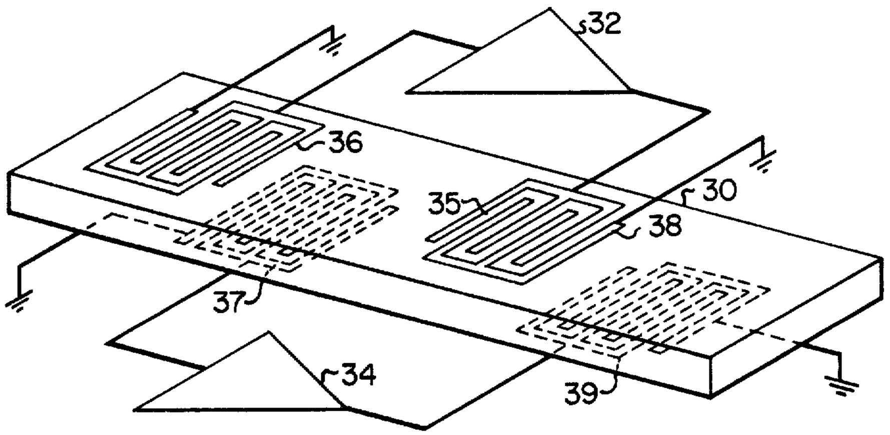
FIG. 3*a* is a schematic diagram of a dual acoustic surface wave oscillator.

FIG. 3*a* is a schematic diagram of a pair of ASW oscillators coupled to a common substrate of piezoelectric material 30. Each oscillator comprises an amplifier 32 and 34, which are each connected to a separate set of ID transducers, 36 and 38, 37 and 39, respectively, deposited a predetermined distance, l, apart on each side of the common substrate. The operation of both oscillators is the same as the operation of the one described in connection with the force-sensing device of FIG. 1.

Figure 3B:
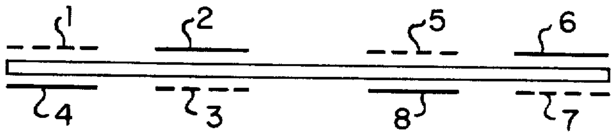
FIG. 3*b* is a one-dimension side view of the dual acoustic surface wave oscillator showing only the arrangement of interdigital transducers and grounding planes.

Even though most of the ASW energy penetrates to a depth of only about one wave length, there is still some second-order signal cross-talk or interaction between the transducers of one oscillator with those of the other oscillator. Two techniques are successful for reducing such cross-talk. Referring to FIG. 3*b*, the first technique for reducing cross-talk requires that each transducer set be offset on its respective surface of substrate 30 along the direction of wave propagation such that no transducer is directly opposite another transducer disposed on the other side. Grounding plane 2 is then disposed on one surface of the substrate in a position substantially aligned with transducer 3 on the opposing side of the substrate. Grounding planes 4, 6 and 8 are similarly disposed on the opposite side from the corresponding transducers 1, 7 and 5, respectively. For this embodiment of the invention, since the signal path for spurious signals from transducer 1 to grounding plane 4 is shorter and to a lower potential generally than from transducer 1 to transducer 3, signal interaction between transducer 1 and 3 is reduced. Similarly, cross-talk between transducers 5 and 7 is also reduced.

Figure 3C:
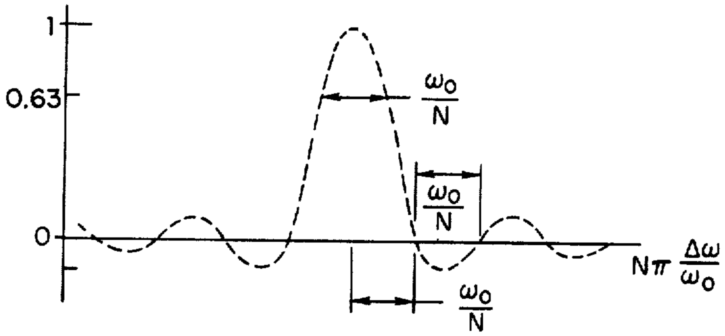
FIG. 3*c* shows the typical frequency response curve of an interdigital transducer.

The second technique employs the frequency selectivity of ID transducers. Referring again to FIG. 3*a*, the bandwidth of ID transducer is inversely proportional to the number and spacing of the fingers 35 comprising it. FIG. 3*c* shows the frequency response curve of such transducers, which is characterized by the relation $Y = \sin x/x$. Zeroes in the response curve occur at mathematical $\pm\,\omega_o/N$ where $\omega_o$ is the center frequency of the transducer and N is the number of periodic sections in the transducer. The periodic section of an ID transducer contains one wave length of the signal generated or detected by the transducer (i.e. 3 fingers). No acoustic surface waves are propagated at frequencies corresponding to $\omega_o \pm \omega_o/N$.

Figure 3D:
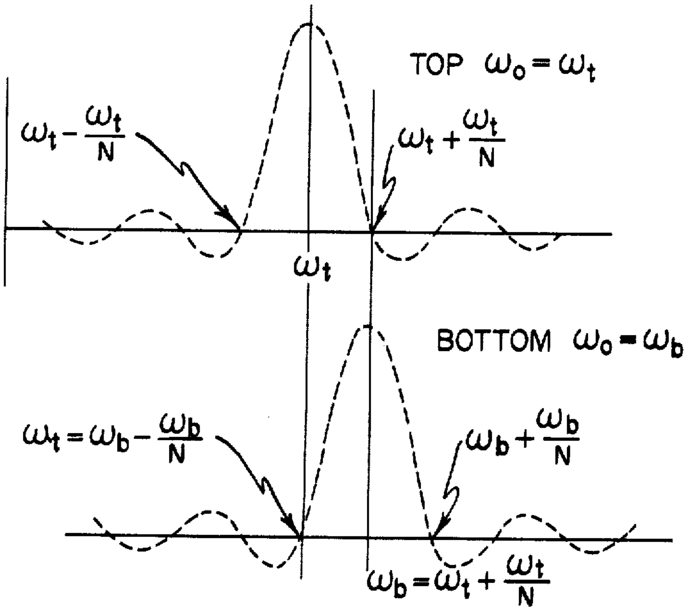
FIG. 3*d* illustrates the use of the response characteristic shown in FIG. 3*c* for reducing dual oscillator interaction.

Referring now to FIG. 3*d*, if the center frequency of the transducers of one transducer set (referred to as the top) is $\omega_t$, then zeroes occur at $\omega_t \pm \omega_t/N$. If the center frequency of the transducers of the other transducer set (referred to as the bottom) is $\omega_b$, then zeroes occur at $\omega_b \pm \omega_b/N$. In accordance with the principles of the present invention, when $\omega_t \cong \omega_b - \omega_b/N$ and $\omega_b \cong \omega_t +$ $\omega_r/N$, cross-talk between transducer sets at the frequencies of greatest wave energy is significantly reduced.

Figure 4:
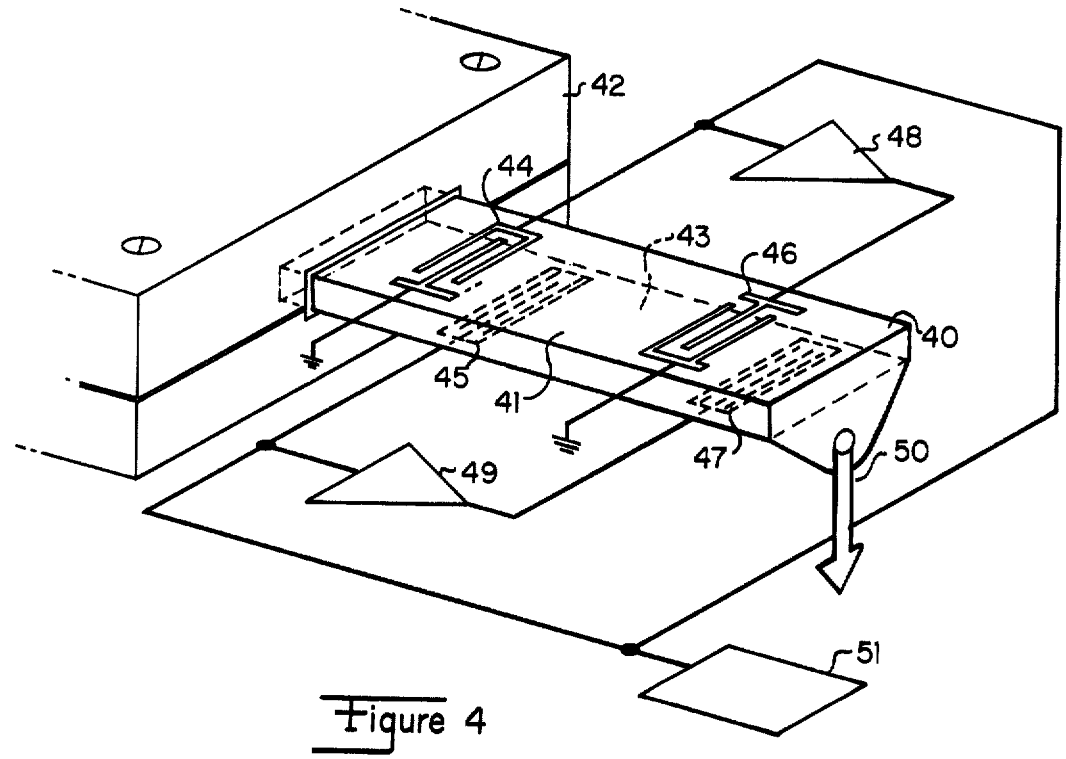
FIG. 4 is a schematic diagram of a high-sensitivity, temperature-compensated force-sensing device.

FIG. 4 shows the preferred embodiment of the high-sensitivity, temperature-compensated stress sensor, which is similar in configuration to the cantilever orientation of the embodiment shown in FIG. 1. A substrate of quartz 40 having a top surface 41 and bottom surface 43 is rigidly held at one end by mounting 42 and force 50 is applied at the other end. The substrate 40 is polished on both sides, and one set of two ID transducers are deposited on each side. Each transducer set is deposited so that ASW propagation is parallel to the axis of the cantilever beam, and offset in the direction of propagation with respect to one another as described for the dual oscillator of FIG. 3*a*. The transducer set consisting of transducers 44 and 46 is connected to amplifier 48 forming a first ASW oscillator, and the transducer set comprising transducers 45 and 47 to amplifier 49 forming a second ASW oscillator. A grounding plane is deposited on the opposite side of the substrate from and corresponding to each of the ID transducers. The purpose of the grounding planes is to diminish the signal interaction between the transducers on opposite sides of the substrate, as explained above. The grounding planes cause negligible perturbation to ASW propagation between transducers of a set because the metal is very thin relative to the wave length of the signal propagated.

With force so applied, a tensile stress on the top surface 41 causes the frequency of the first oscillator to decrease; i.e. $f_1 - \Delta f_1$, and a corresponding compressive stress on the bottom surface 43 increases the frequency of the second oscillator to $f_2 + \Delta f_2$. By appropriate transducer designs, $f_1$ may be set equal to $f_2$ in the absence of force 50. Also, if the ID transducers were symmetrically placed, $\Delta f_1 = \Delta f_2$. However, since the transducer sets are disposed asymmetrically in order to reduce cross-talk, $\Delta f_1 \neq \Delta f_2$ in this embodiment. Of course a change in temperature affects the frequencies of both oscillators by identical amounts, i.e. $\Delta f_t$. Hence, the outputs of the two oscillators are:

$$f_{o1} = f_1 - \Delta f_1 + \Delta f_t$$

$$f_{o2} = f_1 + \Delta f_2 + \Delta f_t$$

If these outputs are mixed and the difference frequency determined with mixer 51, we get a signal whose frequency is proportional to the stress as given below:

$$F_{mixer(-)} = f_1 + \Delta f_1 + \Delta f_t - \Delta f_1 + \Delta f_2 - \Delta f_t = \Delta f_1 + \Delta f_2 \cong 2\Delta f_1$$

The above described embodiment provides approximately twice the stress sensitivity of the embodiment of FIG. 1. In addition, the sensor is compensated for variations in ambient temperature.

Figure 5:
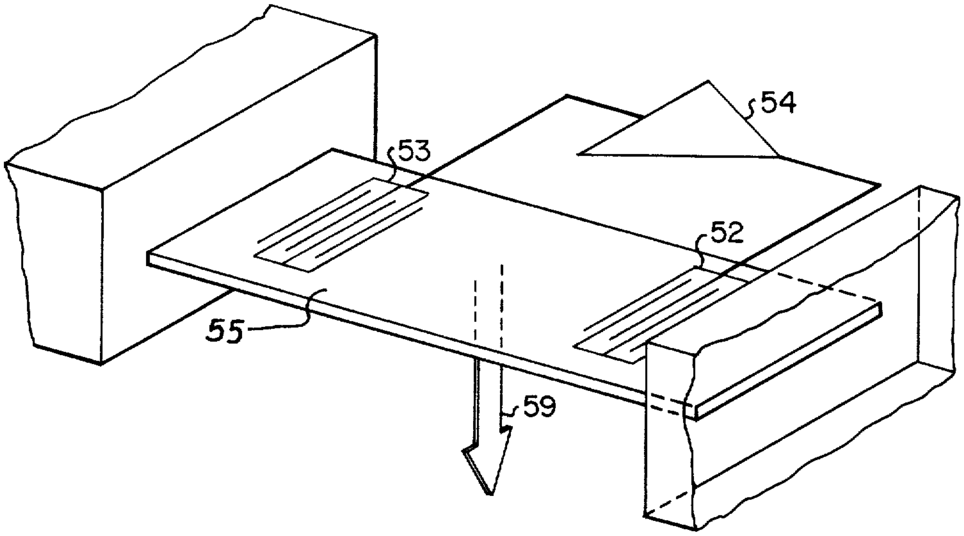
FIG. 5 is a schematic diagram of another embodiment of the device of FIG. 1.

Referring now to FIG. 5, another embodiment of a force-sensing device employing an ASW oscillator is shown. The beam of piezoelectric substrate 55 in this arrangement is clamped at both ends and the force 59 to be measured is applied at the midpoint between the ID transducers 52 and 53. Transducers 52 and 53 are connected to amplifier 54.

Transducer set orientation relative to the crystallographic oreientation of the substrate strongly influences the propagation as well as the frequency versus temperature characteristics of the ASW. Furthermore, transducer set orientation relative to the point of application and direction of the force applied to the substrate is an important consideration in the design of a force-sensing device employing an ASW oscillator. For example, the transducer set in the embodiment of FIG. 5 could be reoriented orthogonally to the axis of the beam. In such orientation, however, the sensitivity to applied force is considerably less since changes in elastic constants and density of the piezoelectric material are caused by cross-coupling of stresses within the crystal lattice of the substrate, and there is virtually no change in the distance, l, between transducers 52 and 53.

Figure 6:
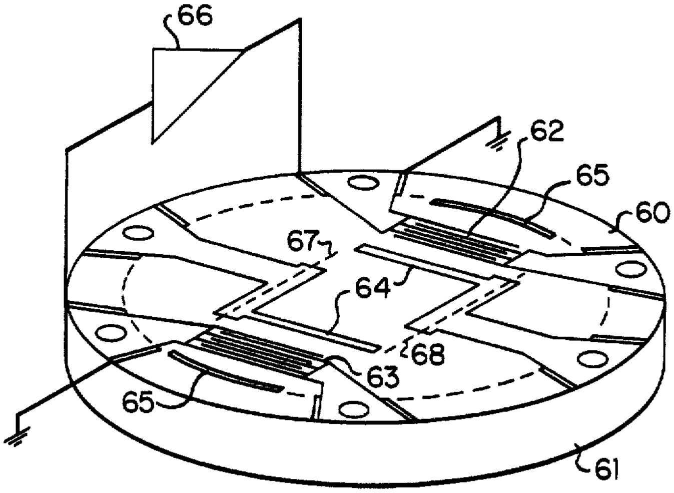
FIG. 6 is a schematic diagram for an acoustic surface wave oscillator used as a pressure-sensing device.

FIG. 6 shows an application of the stress sensitivity of an ASW oscillator for measuring pressures. The sensor consists of a thin active diaphragm of piezoelectric material 60 and a corresponding ring-shaped mounting body 61. The underside of the diaphragm is provided with ID transducers 62 and 63, shield lines 64 and acoustic absorbers 65. Diaphragm 60 is bonded to body 61, which is also made of piezoelectric material having the same crystallographic orientation as the diaphragm. Shield lines 64 are provided to reduce the electromagnetic transmission between the two transducers. The acoustic absorbers 65 reduce spurious effects due to reflected waves from the boundaries. The output of amplifier 66 is connected to generator ID transducer 62 and the input to receiver ID transducer 63 to form an ASW oscillator. The pressure sensor can be adapted for measuring absolute pressures in which case the cavity formed by diaphragm 60 covering mounting body 61 is evacuated and sealed. Measurement of gage pressures is facilitated by providing a small porthole in the body.

The effect of force on the elastic constants and density of diaphragm-shaped piezoelectric material is different from previously discussed configurations by virtue of crystal lattice interaction. By cutting longitudinal dimples 67 and 68 parallel and along each side of the path of ASW propagation, the sensitivity of this device may be increased nearly two-fold. The dimples tend to confine the stress in the diaphragm to the area between transducers 62 and 63 in the direction of propagation of the ASW's.

Figure 7A:
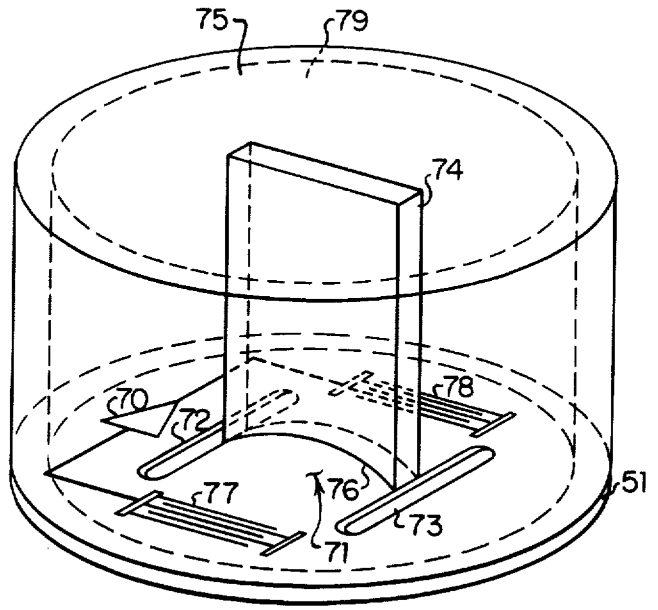
FIG. 7*a* is another embodiment of the pressure-sensing device of FIG. 6.

An extension of this concept is shown in FIG. 7*a* where the longitudinal dimples 67 and 68 have been cut all the way through substrate 71 to form slots 72 and 73. An activator 74 is inserted between substrate 71 and thin diaphragm 75 to transmit the force of the pressure load on diaphragm 75 to the piezoelectric substrate. This activator has an archway 76 that allows substantially unrestricted propagation of an ASW between transducers 77 and 78. Thin diaphragm 75 is bonded to activator 74, and the cylindrical body 79 which is an integral part of diaphragm 75, is also bonded onto the substrate 71. Amplifier 70 is connected to transducers 77 and 78 to form an ASW oscillator.

Figure 7B:
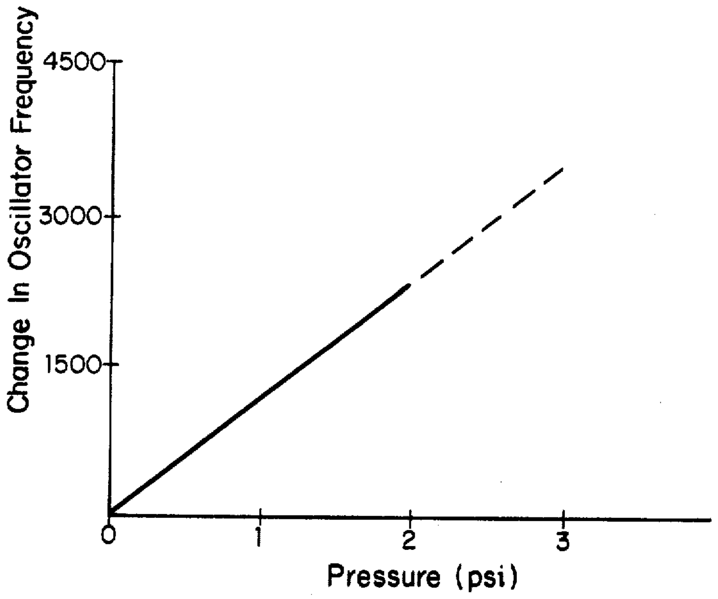
FIG. 7*b* is a plot of the output signal of the pressure-sensing device of FIG. 7*a*.

In operation, the pressure acting on diaphragm 75 causes the area of substrate 71 between the slots to bend in response to the travel of activator 75 without interferring with the propagation of an ASW. The changes in oscillator frequency caused thereby are a function of the pressure acting on diaphragm 55. FIG. 7*b* shows a plot of frequency versus pressure for the configuration of FIG. 7*a* for which the sensitivity is on the order of 1500 Hz/psi for an oscillator operating at approximately 41 MHz.

Figure 8:
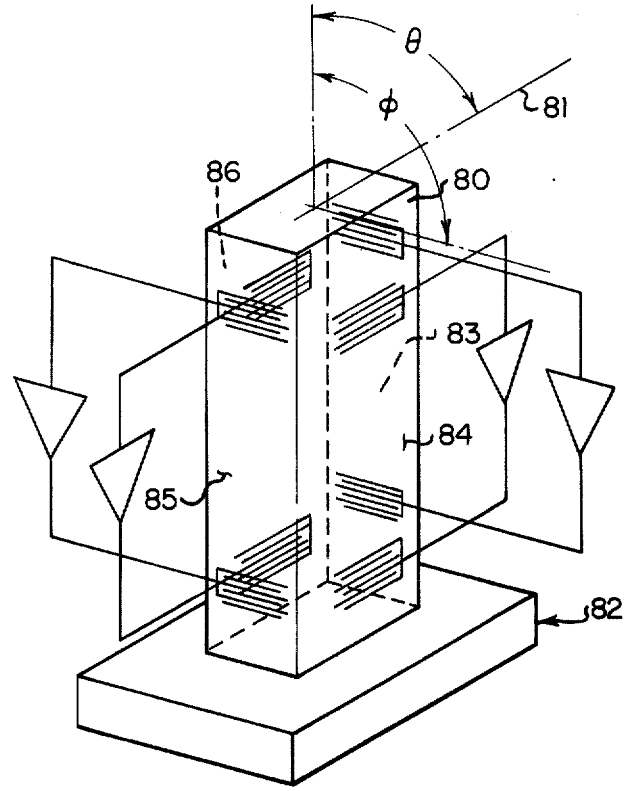
FIG. 8 is a schematic view of a force-sensing device employing several acoustic surface wave oscillators constructed according to the principles of this invention.

More than two ASW oscillators may be incorporated onto a multi-surface elastic material for the sensing of both magnitude and direction of force. Referring to FIG. 8, such a device designed in accordance with the principles of the present invention is shown. It consists of a columnar substrate 80 having an upper end bonded to a mounting surface 81 and a lower end bonded to a weight 82. Each of the four surfaces of column 80 incorporate ASW oscillators which are located in this diagram by reference to their respective substrate surfaces 83, 84 85 and 86. As mounting surface 81 is rotated through angles $\pm\theta$ and/or $\pm\phi$, the surfaces of substrate 80 become variously stressed since weight 82 will tend to stay at rest. For example, for a rotation through the $+\theta$ angle, surface 85 is under compression and surface 83 is in tension. The central portion of surfaces 84 and 86 are essentially unchanged, while the edge-portion nearest surface 85 is in compression and the edge-portion nearest surface 83 is in tension. By appropriate electronic resolution of the change in frequency of the output signal of each ASW oscillator, the amount of inclination and its direction can be determined. More surfaces with ASW oscillators can be added to substrate 80 for greater accuracy and resolution.

Figure 9:
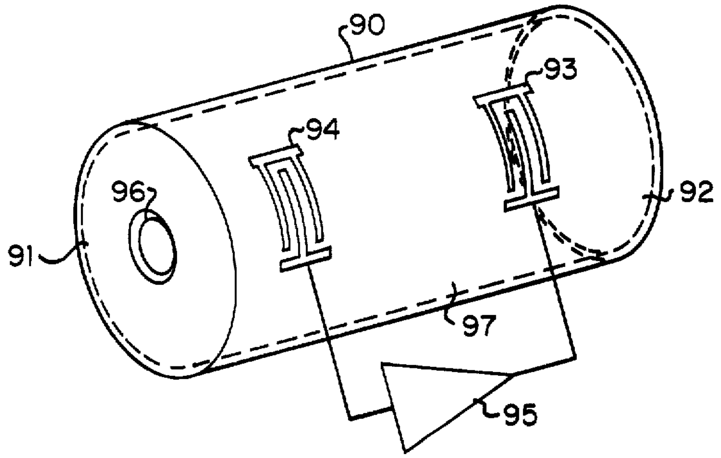
FIG. 9 is a schematic view of another pressure-sensing device utilizing the principles of the present invention.

FIG. 9 shows yet another pressure-sensing device. A cylindrical piece of piezoelectric material 90 is cored out so that the cylindrical surface 97 now constitutes the pressure diaphragm. The two end caps 91 and 92 are bonded to each end of the hollowed cylinder. End cap 91 has a pressure entry port 96. Variation in pressure stresses the cylindrical surface. The transducers 93 and 94 are placed in a direction that is most efficient for propagation, depending on the orientation of the crystal axes. These transducers are then connected to a wide band amplifier 95 to produce an ASW oscillator whose frequency is a function of the pressure applied to the inside of the cylinder 90 via entry port 96.

What is claimed is:

1. A dual acoustic surface wave oscillator comprising:

a substrate of piezoelectric material having a first surface and a second surface;

two transducers disposed a predetermined distance apart on the first surface of the piezoelectric material forming a first transducer set for propagating a first acoustic surface wave thereon;

two transducers disposed a predetermined distance apart on the second surface of the piezoelectric material forming a second transducer set for propagating a second acoustic surface wave thereon;

a first amplifier connected to the first transducer set forming a first acoustic surface wave oscillator having an output terminal for coupling the output signal therefrom;

a second amplifier connected to the second transducer set forming a second acoustic surface wave oscillator having an output terminal for coupling the output signal therefrom; and mixing means, connected to the output terminals of the first and second acoustic surface wave oscillators, for combining the output signals therefrom to form a resultant output signal having a frequency representing the difference in the frequency of the first and second acoustic surface wave oscillators.

2. The dual acoustic surface wave oscillator of claim 1 wherein:

the piezoelectric material has plane parallel surfaces on which the transducer sets are disposed; and the transducers include interdigital fingers.

3. The dual acoustic surface wave oscillator of claim 1 wherein:

each transducer set is offset on its respective surface along the direction of wave propagation such that no transducer is directly opposite another transducer of the other set;

a first set of two grounding planes is disposed on the second surface of the piezoelectric material in a position directly opposite the first set of two transducers for reducing signal interaction between the first and second set of transducers; and a second set of two grounding planes is disposed on the first surface of the piezoelectric material in a position directly opposite the second set of two transducers to reduce signal interaction between the second and first set of transducers.

4. The dual acoustic surface wave oscillator of claim 1 wherein:

the transducers of the set disposed on the first surface of the substrate for propagating an electromagnetic signal thereon have a frequency response generally characterized by the mathematical relation $Y = \sin x/x$; and the transducers of the set disposed on the second surface of the substrate for propagating an electromagnetic signal thereon have a frequency response generally characterized by the mathematical relation $Y = \sin x/x$, where $y$ = amplitude and $x$ = frequency;

said first surface transducer set having a frequency of maximum amplitude equal to a frequency of minimum amplitude of the second surface transducer set for reducing signal interaction between transducer sets of the first and second surfaces of the substrate.

5. A force-sensing device employing an acoustic surface wave oscillator comprising:

a substrate of piezoelectric material having a surface on which transducers may be disposed;

mounting means connected to the substrate for rigidly holding the substrate to respond to a force applied thereto;

two transducers disposed a predetermined distance apart forming a transducer set on the surface of the substrate for propagating an acoustic surface wave thereon;

an amplifier connected to the transducer set to form an acoustic surface wave oscillator having an output signal frequency that varies in response to changes in the physical characteristics of the substrate and the distance between the transducers of the transducer set; and output means connected to an output of the acoustic surface wave oscillator for receiving an output signal therefrom;

said physical characteristics of the substrate and distance between transducers of the transducer set changing in response to the force applied to the substrate.

6. The acoustic surface wave force-sensing device of claim 5 wherein:

the piezoelectric substrate is generally elongated in shape in which the planar surfaces have a longitudinal dimension greater than a width dimension;

the elongated piezoelectric substrate is oriented in the mounting means such that one end is rigidly clamped to form a cantilever beam having an axis along the longitudinal dimension of the substrate; and the transducer set is disposed to propagate the acoustic surface wave along a path substantially corresponding to the axis of the cantilever beam.

7. the dual acoustic surface wave oscillator described in claim 1 employed as a temperature-compensated force-sensing device wherein:

the substrate is mounted in mounting means to respond to a component of force applied normal thereto; and the second acoustic surface wave oscillator has an output signal frequency that varies inversely in response to the same component of force applied normal to the substrate when compared to the output signal frequency of the first acoustic surface wave oscillator;

said output signal frequency of the second acoustic wave oscillator being substantially equal to the output signal frequency of the first oscillator when no component of force is applied to the substrate.

8. The temperature-compensated force-sensing device as described in claim 7 wherein the:

resultant output signal has a frequency directly related to the magnitude of the force component applied to the substrate.

9. The temperature-compensated force-sensing device as described in claim 8 wherein the resultant output signal is a signal whose frequency is the algebraic difference between the frequencies of the output signals of the two acoustic wave oscillators.

10. The temperature-compensated force-sensing device of claim 7 wherein the difference frequency of the output signal of the mixing means is substantially zero with no component of force applied normal to a planar surface of the piezoelectric substrate.

11. The temperature-compensated force sensing device of claim 7 wherein:

the output signal frequency of the first oscillator increases in response to compression stress of the first surface;

the output signal frequency of the second oscillator decreases in response to tensile stress of the second surface; and the difference frequency output signal of the mixing means is directly related to the magnitude of the force applied normal to a planar surface of the piezoelectric substrate.

* * * * *